(12) United States Patent
Yi et al.

(10) Patent No.: US 6,207,506 B1
(45) Date of Patent: Mar. 27, 2001

(54) NONVOLATILE MEMORY AND METHOD FOR FABRICATING THE SAME

(75) Inventors: Sang Bae Yi, Seoul; Jin Won Park; Sung Chul Lee, both of Chungcheongbuk-do, all of (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/348,463

(22) Filed: Jul. 7, 1999

(30) Foreign Application Priority Data

Sep. 2, 1998 (KR) .................................................. 98-36140

(51) Int. Cl.[7] .................................................. H01L 21/335
(52) U.S. Cl. .......................... 438/264; 438/287; 438/591; 438/769
(58) Field of Search .................................... 438/775, 591, 438/264, 287, 769, FOR 193, FOR 189

(56) References Cited

U.S. PATENT DOCUMENTS

| 4,868,632 | 9/1989 | Hayashi et al. ........................ 357/54 |
| 5,698,464 | * 12/1997 | Tsunoda . |
| 5,885,870 | * 3/1999 | Maiti et al. . |
| 6,001,694 | * 12/1999 | Shish et al. . |

OTHER PUBLICATIONS

Rama I. Hegde et al., "Growth and Film Characteristics of N20 and NO Oxynitride Gate and Tunnel Dielectrics", J. Electrochemical Soc. vol. 144, No. 3, pp. 1081–1086, Mar. 1997.*

Shin–ichi Minami, "Tunnel Oxide Thickness Optimization for High–Performance MNOS Nonvolatile Memory Devices", IEEE Transactions, vol. E 74, No. 4, Apr. 4, 1991, pp. 875–884.

Rama I. Hegde et al., "Growth and Film Characteristics of $N_sO$ and NO Oxynitride Gate and Tunnel Dielectrics", Electrochem. Soc., vol. 144, No. 3 Mar., 1997, pp. 1081–1086.

Eiichi Suzuki et al., "On Oxide–Nitride Interface Traps by Thermal Oxidation of Thin Nitride in Metal–Oxide–Nitride–Oxide–Semiconductor Memory Structures", IEEE Transactions on Electron Devices, vol. ED–33, No. 2, Feb. 1986, pp. 214–217.

Anirban Roy et al., "Determination of the Trapped Charge Distribution in Scaled Silicon Nitride Monos Nonvolatile Memory Devices By Tunneling Spectroscopy", Solid–State Electronics, vol. 34, No. 10, pp. 1083–1089. (Date Unknown).

(List continued on next page.)

*Primary Examiner*—George Fourson
*Assistant Examiner*—Barbara E. Abbott
(74) *Attorney, Agent, or Firm*—Morgan, Lewis & Bockius LLP

(57) ABSTRACT

Nonvolatile memory capable of programming and erasure and method for fabricating the same, the method comprising the steps of (1) forming an oxide film on a first conduction type semiconductor substrate, (2) conducting an annealing in an NO or $N_2O$ ambient to convert the oxide film into a vertical lamination of a first silicon oxynitride region containing nitrogen and a second silicon oxynitride region containing relatively less nitrogen compared to the first silicon oxynitride region formed on the substrate, (3) patterning a gate electrode on the second oxynitride region, (4) forming second conduction type source, and drain impurity diffusion regions in surfaces of the substrate on both sides of the gate electrode, whereby facilitating a simple and easy fabrication process, a low programming voltage, a high performance, and a high device reliability.

14 Claims, 8 Drawing Sheets

OTHER PUBLICATIONS

Peter C.Y. Chen, "Threshold–Alterable Si–Gate MOS Devices", IEEE Transactions on Electron Devices, vol. ED–24, No. 5, May 1977, pp. 584–586.

Eiichi Suzuki et al., "Traps Created at the Interface Between the Nitride and the Oxide on the Nitride by Thermal Oxidation", Appl. Phys. Lett. 42 (7), Apr. 1, 1983, pp. 608–610.

Takaaki Nozaki et al., "A 1–Mb EEPROM with Monos Memory Cell for Semiconductor Disk Application", IEEE Journal of Solid–State Circuits, vol. 26, No. 4 Apr. 4, 1991, pp. 497–501.

* cited by examiner

NONVOLATILE MEMORY AND METHOD FOR FABRICATING THE SAME

BACKGROUND OF THE INVENTION

1. Field of the Invention

The present invention relates to a semiconductor memory, and more particularly, to a nonvolatile memory and a method for fabricating the same.

2. Background of the Related Art

In view of fabrication process, in the nonvolatile memory technology, there are at large the floating gate group and the MIS (Metal-Insulator-Semiconductor) group in which two or three dielectric films are stacked. A related art nonvolatile memory will be explained with reference to the attached drawings. FIG. 1 illustrates a section of a first exemplary related art nonvolatile memory. The nonvolatile memory of the floating gate group shown in FIG. 1 implements memory using a potential well, identical to an ETOX (EPROM with tunnel oxide) widely applied to flash EEPROMs, currently. The nonvolatile memory of the floating gate group employs two or three layered polysilicon process. In the case of three layered polysilicon process, an erasure gate polysilicon layer is provided for use only in erasure exclusively, in which erasure can be controlled, independently. The related art nonvolatile memory shown in FIG. 1 illustrates a nonvolatile memory with two layered polysilicon, provided with a semiconductor substrate 11, a first oxide film 13 formed on the semiconductor substrate 11, a floating gate formed on the first oxide film 13, a second oxide film 17 formed on the floating gate 15, a control gate 19 formed on the second oxide film 17, and source/drain impurity diffusion regions 21 and 21a formed in surfaces of the substrate 11 on both sides of the control gate 19. The first oxide film 13 is called a tunneling oxide film, and the second oxide film 17 is called an IPD (Inter Polysilicon Dielectric).

The programming and erasure operation of the nonvolatile memory of the floating gate group is as follows.

In programming, an adequate positive (+) voltage is applied to the control gate 19, so that the positive voltage couples to the floating gate 15 through the second oxide film 17, an IPD layer, to boost a potential of the floating gate 15. Accordingly, an electric field intensity on the first oxide film 13, a tunneling oxide film, is increased, to cause hot electrons generated by the electric field between the source impurity diffusion region 21 and the drain impurity diffusion region 21a injected into the floating gate 15 through the tunneling oxide film. Eventually, the tunneled electrons in the floating gate 15 is trapped by the tunneling oxide film and the IPD layer, both form a potential well. The erasure is removal of the hot electrons trapped in the potential well from the floating gate 15, in which a negative (−) voltage is applied to the control gate 19 and a positive (+) voltage is applied to the source impurity diffusion region 21, to cause the hot electrons trapped in the floating gate 15 to make a Fowler Nordheim tunneling through the tunneling oxide film into the semiconductor substrate 11.

On the other hand, FIG. 2a illustrates a section of a second exemplary related art nonvolatile memory of the MIS group. The nonvolatile memory of the MIS group implement memory using a trap at an interface of dielectric film-bulk, dielectric film-dielectric film, dielectric film-semiconductor, of which typical one is MONOS/SONOS (Metal-oxide-nitride-oxide-semiconductor/Polysilicon-oxide-nitride-oxide-semiconductor), that has a simple structure enough to allow application of an existing CMOS fabrication process as it is using single-polysilicon process and an excellent endurance of the programming/erasure.

Referring to FIG. 2a, the nonvolatile memory of the MIS group with an MNOS/SNOS structure is provided with a semiconductor substrate 11, a first oxide film 13 formed on the semiconductor substrate 11, a nitride film 14 formed on the first oxide film 13, a gate electrode 23 on the nitride film 14, and source/drain impurity diffusion regions 21 and 21a formed in surfaces of the semiconductor substrate 11 on both sides of the gate electrode 23. In order to content a scale-down, the foregoing nonvolatile memory of the MIS group with an MNOS/SNOS structure should have a thickness of the nitride film 14 reduced. However, as already reported, the thickness of the nitride film 14 can not be reduced below 180 Å which is two times of 90 Å, a center of electrons, in view that the center of electrons are 90 Å in the nitride film 14. An art developed to overcome the scale-down limit of the MNOS/SNOS structure is the MONOS/SONOS structure. That is, as shown in FIG. 2b, the MONOS/SONOS structure is provided with a semiconductor substrate 11, a first oxide film 13 formed on the semiconductor substrate 11, a nitride film 14 formed on the first oxide film 13, a second oxide film 17 formed on the nitride film 14, and a gate electrode 23 formed on the second oxide film 17. As shown in the drawing, an O—N—O structured dielectric film is provided between the gate electrode 23 and the semiconductor substrate 11.

The programming and erasure operation of the nonvolatile memory of MONOS/SONOS structure will be explained.

In programming, an adequate positive (+) voltage is applied to the gate electrode 23, so that electrons are injected from the semiconductor substrate 11 to the nitride film 14 passing through the first oxide film 13 on the semiconductor substrate 11 by tunneling. In this instance, the second oxide film 17 on the nitride film 14 blocks both leakage of the electrons injected to the nitride film 14 toward the gate electrode 23 and injection of holes from the gate electrode 23 into the nitride film 14. In this sense, the first oxide film 13 is called as a tunneling oxide and the second oxide film 17 on the nitride film 14 is called as a blocking oxide film. The electrons injected through the first oxide film 13, the tunneling oxide film, are trapped in a nitride film 14 bulk trap and interface traps at both ends of the nitride film 14, with an increased threshold voltage. Therefore, in order to erase, a negative (−) voltage is applied to the gate electrode 23, so that the trapped electrons are discharged to the semiconductor substrate 11, dropping the threshold voltage to a value before programming. The merits of the foregoing nonvolatile memory of MONOS/SONOS structure comes from the blocking oxide film having a function of a potential barrier. That is, even if a thickness of the nitride film is reduced, the blocking oxide film blocks leakage of the electrons injected into the nitride film 14 and has a comparatively large memory window owing to a high concentration trap formed at an interface of the nitride film-the blocking oxide film. The memory window is a difference of threshold voltages between programming and erasure. And, the blocking oxide film blocks injection of holes from the gate electrode 23, that degrades a device performance, the nonvolatile memory of MONOS/SONOS structure has a high reliability.

However, the related art nonvolatile memories have the following problems.

First, use of the two-, or three layered polysilicon in the nonvolatile memory of floating gate group results in a great step as high as 5000 Å and over, which causes a complicated fabrication process.

Second, despite of the foregoing merits of the nonvolatile memory of MIS group, the nonvolatile memory of MIS group essentially requires growth of an ultra-thin tunneling oxide film of below 20 Å for having a low programming voltage and fast programming. However, the growth of an ultra-thin tunneling oxide film with assured reproducibility and reliability requires a very difficult and sophisticated fabrication process. That is, either a high temperature, and ultra high vacuum cleaning process should be conducted before the oxide film growth or a separate furnace for conducing a silicon oxide film growth and a silicon nitride film deposition on the same time is required for preventing growth of a natural oxide film.

SUMMARY OF THE INVENTION

Accordingly, the present invention is directed to a nonvolatile memory and a method for fabricating the same that substantially obviates one or more of the problems due to limitations and disadvantages of the related art.

An object of the present invention is to provide a nonvolatile memory and a method for fabricating the same, which has a simple and easy fabrication process, a low programming voltage, a high performance, and a high reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the nonvolatile memory capable of programming and erasure, includes a first conduction type semiconductor substrate, a lamination of gate dielectric film formed on the substrate having a portion for trapping electrons, a gate electrode formed on the gate dielectric film, and second conduction type source, and drain impurity diffusion regions formed in surfaces of the substrate on both sides of the gate electrode.

In other aspect of the present invention, there is provided a method for fabricating a nonvolatile memory capable of programming and erasure including the steps of (1) forming an oxide film on a first conduction type semiconductor substrate, (2) conducting an annealing in an NO or $N_2O$ ambient to convert the oxide film into a vertical lamination of a first silicon oxynitride region containing nitrogen and a second silicon oxynitride region containing relatively less nitrogen compared to the first silicon oxynitride region formed on the substrate, (3) patterning a gate electrode on the second oxynitride region, (4) forming second conduction type source, and drain impurity diffusion regions in surfaces of the substrate on both sides of the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
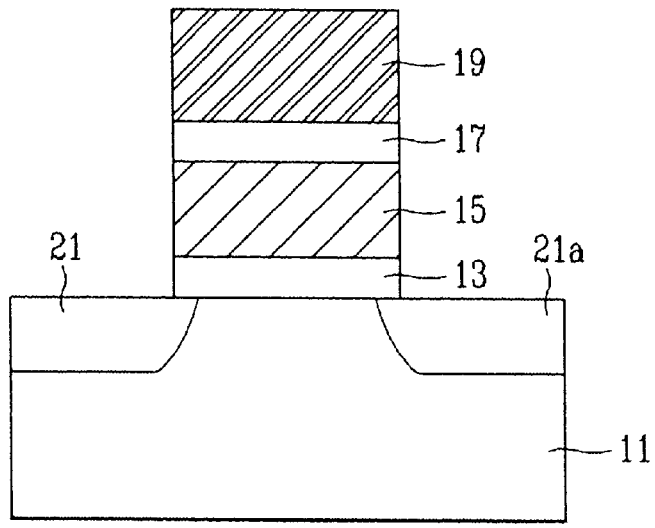
FIG. 1 illustrates a section of a first exemplary related art nonvolatile memory.
Figure 2A:
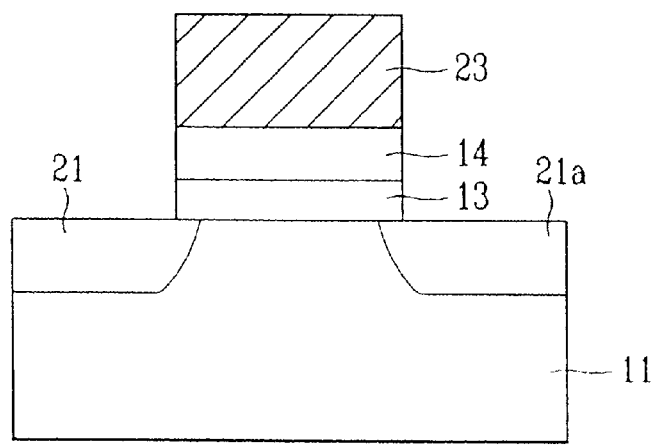
FIG. 2a illustrates a section of a second exemplary related art nonvolatile memory.
Figure 2B:
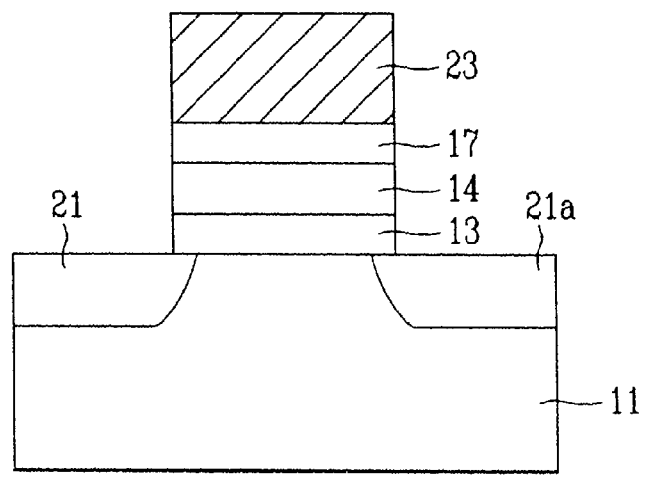
FIG. 2b illustrates a section of a third exemplary related art nonvolatile memory of MONOS/SONOS structure.
Figure 3:
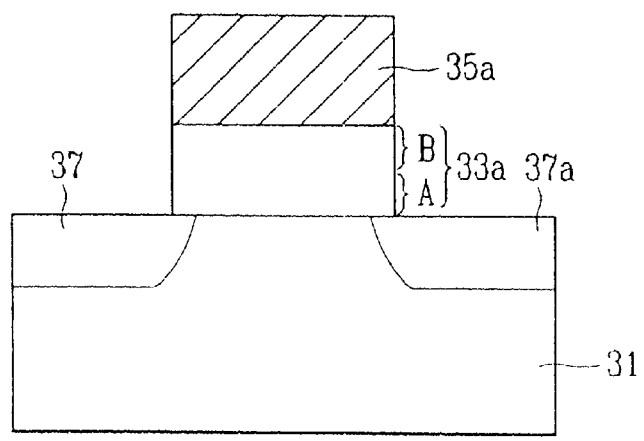
FIG. 3 illustrates a section of a nonvolatile memory in accordance with a first embodiment of the present invention.

Reference will now be made in detail to the preferred embodiments of the present invention, examples of which are illustrated in the accompanying drawings. In fabrication of the nonvolatile memory of the present invention, a CMOS fabrication process is employed. That is, in the CMOS fabrication process in which a substrate, a gate oxide film, a gate electrode, and source and drain impurity diffusion regions are formed, the gate oxide film is merely used for insulating the gate electrode and the substrate. According to the nonvolatile memory of the present invention fabricated employing the aforementioned CMOS fabrication process, a programming and erasure operation, which is a feature of the nonvolatile memory, are made possible. FIG. 3 illustrates a section of a nonvolatile memory in accordance with a first embodiment of the present invention.

Referring to FIG. 3, the nonvolatile memory in accordance with a first embodiment of the present invention includes a first conduction type semiconductor substrate 31, a insulating film 33a formed on the substrate 31 of a lamination of a silicon oxynitride region A containing a high concentration of nitrogen and a silicon oxynitride region B containing nitrogen of a concentration relatively lower than the silicon oxynitride region A, a gate electrode 35a formed on the insulating film 33a, second conduction type source, and drain impurity diffusion regions 37 and 37a formed in surfaces of the semiconductor substrate 31 on both sides of the gate electrode 35a. The silicon oxynitride region A containing a high concentration of nitrogen in the insulating film 33a is disposed on the semiconductor substrate 31 side, and the silicon oxynitride region B containing nitrogen of a concentration relatively lower than the silicon oxynitride region A is disposed on the gate electrode 35a side. As the high concentration of nitrogen is below 3 wt %, the relatively low concentration is very low.

A method for fabricating the aforementioned nonvolatile memory in accordance with a first embodiment of the present invention will be explained. FIGS. 4a~4d illustrate sections showing the steps of a method for fabricating a nonvolatile memory in accordance with a first embodiment of the present invention.

Figure 4A:
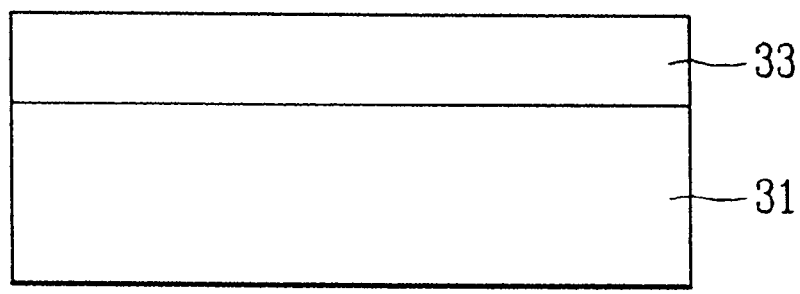
FIGS. 4a~4d illustrate sections showing the steps of a method for fabricating a nonvolatile memory in accordance with a first embodiment of the present invention.
Figure 4B:
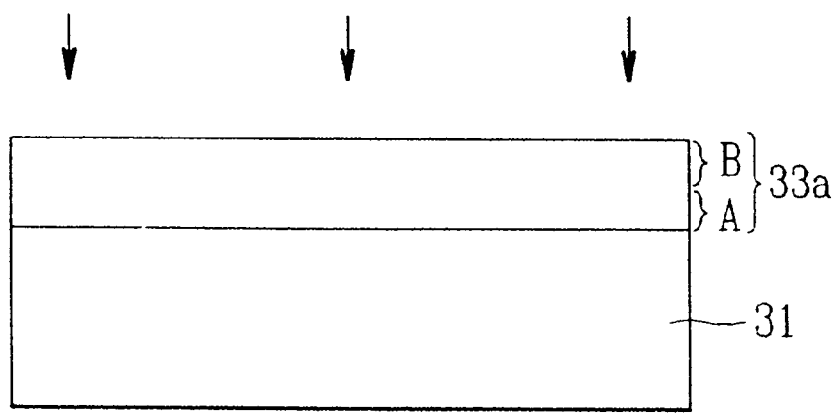
Figure 4C:
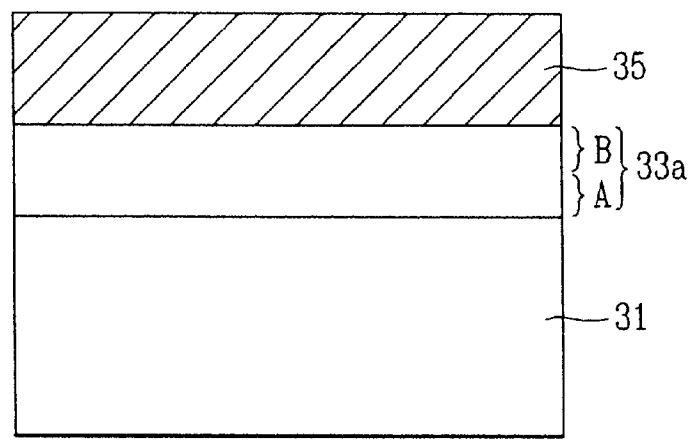
Figure 4D:
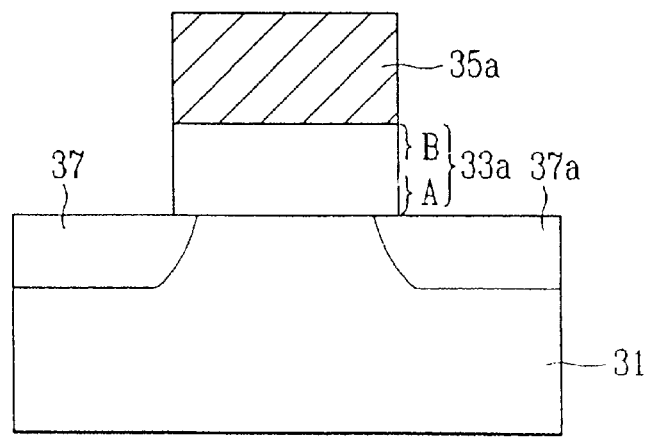

Referring to FIG. 4a, a silicon oxide film 33 is grown on a semiconductor substrate 31 in an oxygen ambient. As shown in FIG. 4b, an annealing is conducted in an NO or $N_2O$ gas ambient to form an insulating film 33a of lamination of a silicon oxynitride region A containing a high concentration of nitrogen disposed on the substrate 31 side and a silicon oxynitride region B containing nitrogen of a concentration relatively lower than the silicon oxynitride region A disposed thereon. The annealing in the NO ambient is conducted at a temperature in a range of 800~1000° C., and most preferably at approx. 900° C., for 20~30 min. And, the annealing in the $N_2O$ ambient is conducted at a temperature in a range of 850~1100° C., and most preferably at approx. 950° C., for a duration the same with the case of annealing in NO ambient. Then, as shown in FIG. 4c, a gate electrode material, for example, a polysilicon layer 35 is formed on the insulating film 33a, and, as shown in FIG. 4d, the polysilicon layer 35 and the insulating film 33a are selectively removed, to form a gate electrode 35a and selectively expose surfaces of the semiconductor substrate 31. Second conduction type impurity ions are injected, to form source, and drain impurity diffusion regions 37 and 37a in the surfaces of the exposed semiconductor substrate 31.

Figure 5A:
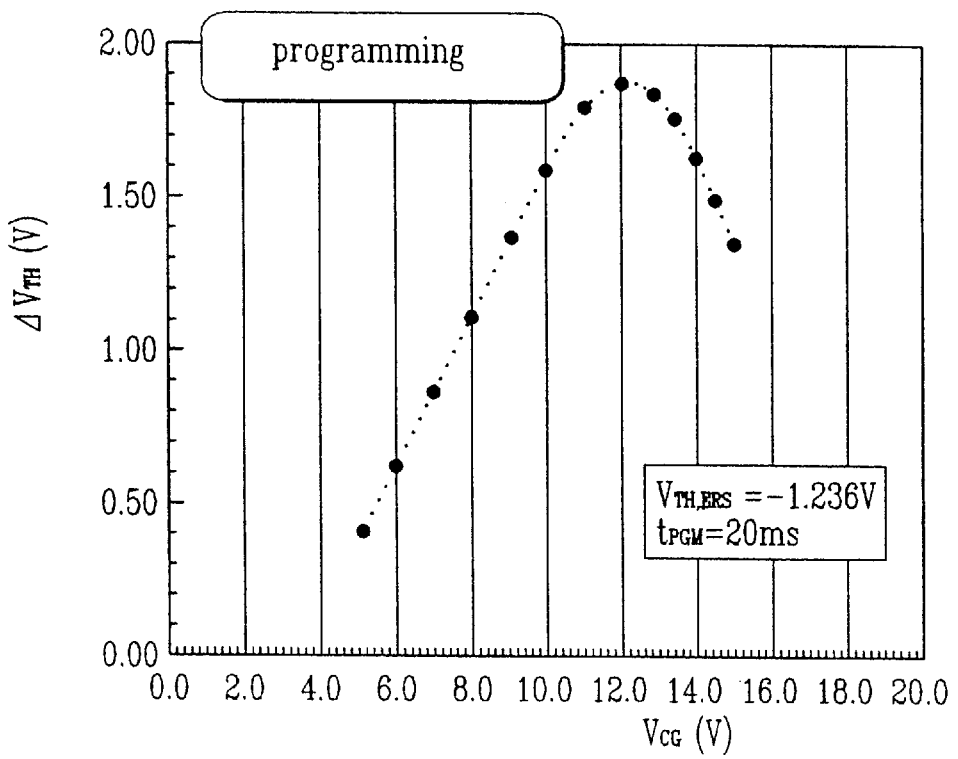
FIGS. 5a and 5b respectively illustrate graphs showing programming and erasure characteristics of a nonvolatile memory in accordance with a first embodiment of the present invention.

FIG. 5a illustrates a graph showing a data programming characteristic of a nonvolatile memory in accordance with a first embodiment of the present invention, which is formed by growing the silicon oxide film 33 to a thickness of 40 Å at a temperature of 800° C. and subjecting to an annealing at 1050° C. in an NO or $N_2O$ ambient. That is, the source impurity diffusion region 37, the drain impurity diffusion region 37a, and the semiconductor substrate 31 are grounded in common, and a voltage having a positive polarity (+) with respect to the semiconductor substrate 31 is applied to the gate electrode 35a, to program a data. In this instance, the threshold voltage is increased in a positive (+) direction.

Figure 5B:
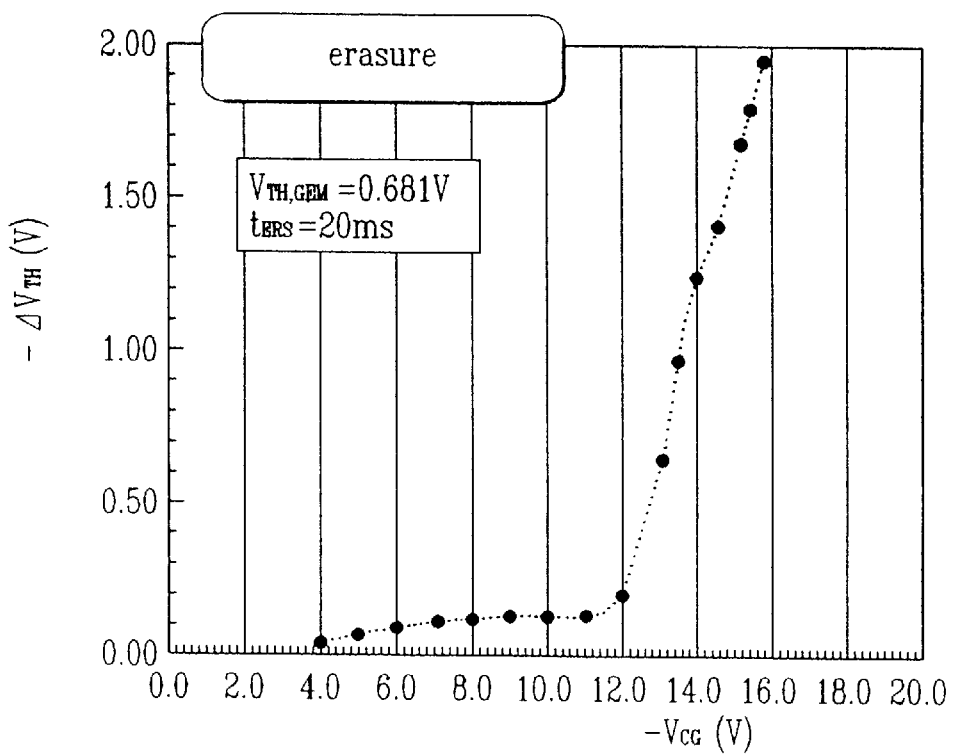

FIG. 5b illustrates a graph showing an erasure characteristic of a nonvolatile memory in accordance with a first embodiment of the present invention. The source impurity diffusion region 37, the drain impurity diffusion region 37a, and the semiconductor substrate 31 are grounded in common, and a voltage having a negative polarity (−) with respect to the semiconductor substrate 31 is applied to the gate electrode 35a, to erase a programmed data. In this instance, the threshold voltage is increased in a negative (−) direction. As can be known from FIGS. 5a and 5b, a memory state can be switched from an erasure state to a programming state (from a low threshold voltage to a high threshold voltage) or vice versa by applying a voltage adequately higher than, and opposite to a voltage in a read operation to the gate electrode 35a. In this instance, a memory window size defined as a difference of the threshold voltages in a programming state and in an erasure state is 1.85V.

Figure 6:
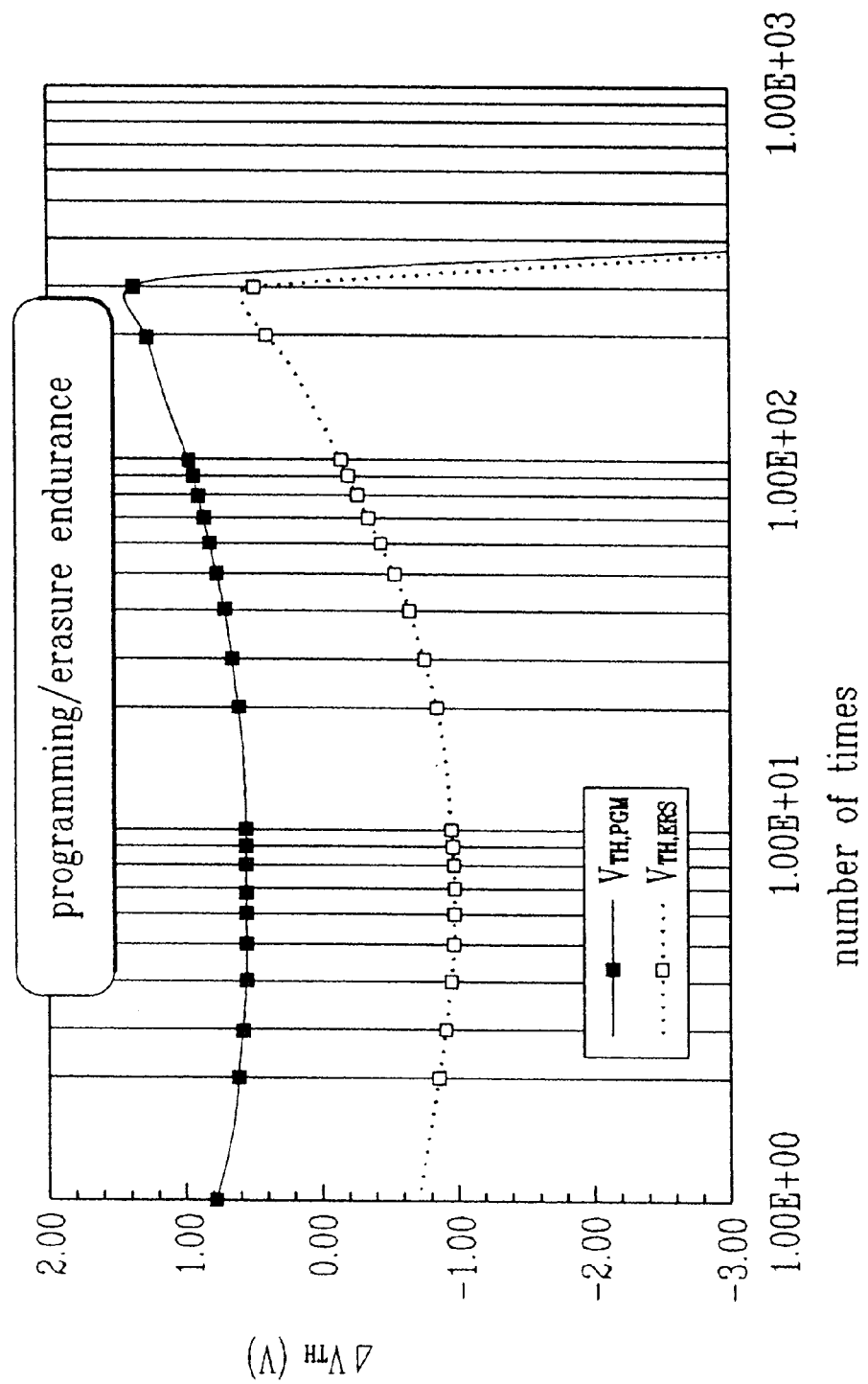
FIG. 6 illustrates a graph showing programming, and erasure endurances of a nonvolatile memory in accordance with a first embodiment of the present invention.

FIG. 6 illustrates a graph showing programming, and erasure endurances of a nonvolatile memory in accordance with a first embodiment of the present invention, wherefrom it can be known that approx. 100 times of repetitive programming and erasure are available.

Figure 7:
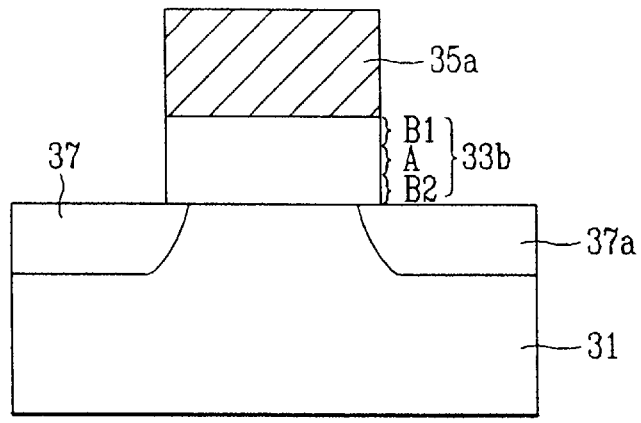
FIG. 7 illustrates a section of a nonvolatile memory in accordance with a second embodiment of the present invention; and, FIGS. 8a~8d illustrate sections showing the steps of a method for fabricating a nonvolatile 8 memory in accordance with a second embodiment of the present invention.

FIG. 7 illustrates a section of a nonvolatile memory in accordance with a second embodiment of the present invention.

Referring to FIG. 7, the nonvolatile memory in accordance with a second embodiment of the present invention includes a first conduction type semiconductor substrate 31, an insulating film 33b of a lamination of a central silicon oxynitride region A of a high nitrogen concentration and overlying, and underlying silicon oxynitride regions B1 and B2 of relatively low nitrogen concentrations, a gate electrode 35a formed on the insulating film 33b, source, and drain impurity diffusion regions 37 and 37a formed in surfaces of the semiconductor substrate 31 on both sides of the gate electrode 35a. The lamination of silicon oxynitride B2-A-B1 of a low nitrogen concentration—a high nitrogen concentration—a low nitrogen concentration can be obtained by annealing a silicon oxide film in an NO or $N_2O$ ambient to form the silicon oxynitride lamination A-B1 of a high nitrogen concentration-a low nitrogen concentration and a subsequent re-oxidation of the silicon oxynitride lamination A-B1.

A method for fabricating a nonvolatile memory in accordance with a second preferred embodiment of the present invention will be explained with reference to FIGS. 8a~8d.

Figure 8A:
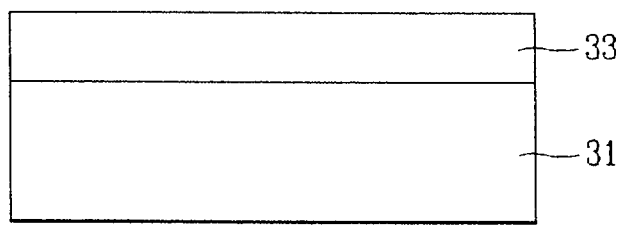
Figure 8B:
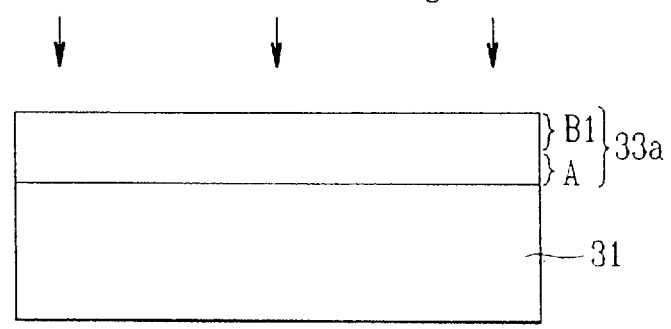
Figure 8C:
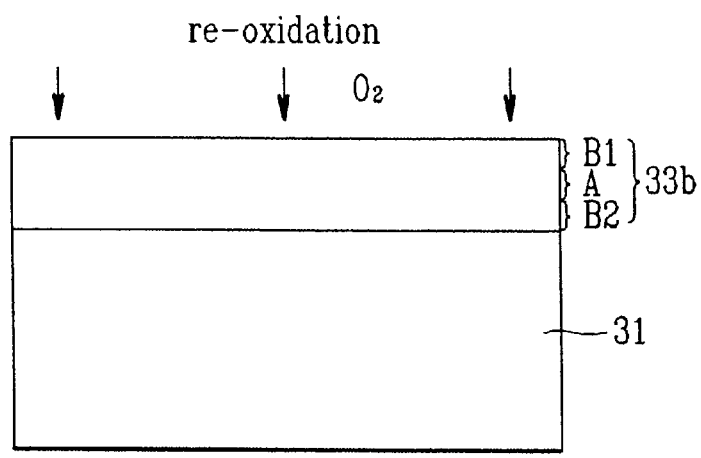
Figure 8D:
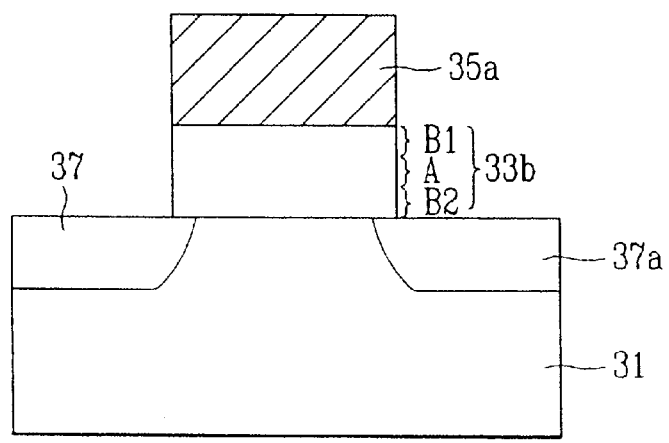

Referring to FIG. 8a, a silicon oxide film 33 is formed on a first conduction type semiconductor substrate 31. As shown in FIG. 8b, an annealing is conducted under an NO or $N_2O$ ambient to form an insulating film 33a having a silicon oxynitride film A of a high nitrogen concentration at a side of the semiconductor substrate 31 and a silicon oxynitride film B1 of a relatively low nitrogen concentration thereon. The annealing in the NO ambient is conducted at a temperature in a range of 800~1000° C., and most preferably at approx. 900° C., for 20~30 min. And, the annealing in the $N_2O$ ambient is conducted at a temperature in a range of 850~1100° C., and most preferably at approx. 950° C., for a duration the same with the case of annealing in NO ambient. As shown in FIG. 8c, a re-oxidation is conducted under an oxygen ambient to form a silicon oxynitride region B2 of a relatively low nitrogen concentration under the silicon oxynitride region A of a high nitrogen concentration. Consequently, an insulting film 33b of a lamination of a silicon oxynitride region B1 of a low nitrogen—a silicon oxynitride region A of a high nitrogen concentration—a silicon oxynitride region B2 of a low nitrogen concentration is formed. Then, as shown in FIG. 8d, a gate electrode material layer, for example, a polysilicon layer is formed on the insulating film 33b, and the polysilicon layer and the insulating film 33b are removed selectively, to form a gate electrode 35a. Impurity ions are injected into surfaces of the semiconductor substrate 31 using the gate electrode 35a as a mask, to form second conduction type source and drain impurity diffusion regions 37 and 37a therein, thereby completing fabrication of a nonvolatile memory in accordance with a second embodiment of the present invention.

The nonvolatile memory and method for fabricating the same as explained has the following advantages.

First, the formation of a nonvolatile memory which permits programming and erasure using a CMOS fabrication process facilitates a simple fabrication process.

Second, since a process for growing the ultra-thin tunneling oxide film is not required, formation of a gate dielectric film which acts as a memory is possible.

Third, easy programming and erasure by an electrical means are available.

Fourth, high step can be lowered because a single polysilicon layer is used.

It will be apparent to those skilled in the art that various modifications and variations can be made in the nonvolatile memory and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a nonvolatile memory capable of programming and erasure, the method comprising the steps of:
   (1) forming a silicon oxide film on a first conduction type semiconductor substrate;
   (2) conducting an annealing in a NO or N$_2$O ambient to convert the silicon oxide film into a lamination of a first silicon oxynitride region containing nitrogen and a second silicon oxynitride region containing relatively less nitrogen compared to the first silicon oxynitride region wherein the first silicon oxynitride region is formed on the substrate and the second silicon oxynitride region is formed on the first silicon oxynitride region;
   (3) patterning a gate electrode directly on the second silicon oxynitride region;
   (4) forming second conduction type source and drain impurity diffusion regions in surfaces of the substrate on both sides of the gate electrode.

2. The method as claimed in claim 1, wherein either the substrate is of P conduction type and the source and drain impurity diffusion regions are of N conduction type or the substrate is of N conduction type and the source and drain impurity diffusion regions are of P conduction type.

3. The method as claimed in claim 1, wherein the annealing in the NO ambient is conducted at a temperature in a range of 800~1000° C.

4. The method as claimed in claim 1, wherein the annealing in the N$_2$O ambient is conducted at a temperature in a range of 850~1100° C.

5. The method as claimed in claim 3, wherein a duration of the annealing is 20~30 minutes.

6. A method for fabricating a nonvolatile memory capable of programming and erasure, the method comprising the steps of:
   (1) forming a silicon oxide film on a first conduction type semiconductor substrate;
   (2) conducting an annealing in a NO or N$_2$O ambient to convert the silicon oxide film into a lamination of a first silicon oxynitride region containing nitrogen for trapping electrons and a second silicon oxynitride region containing relatively less nitrogen compared to the first silicon oxynitride region, wherein the first silicon oxynitride region is formed on the substrate and the second silicon oxynitride region is formed on the first silicon oxynitride region;
   (3) subjecting the lamination to re-oxidation for forming a third silicon oxynitride region containing relatively less nitrogen compared to the first silicon oxynitride region between the first silicon oxynitride region and the substrate;
   (4) patterning a gate electrode on the second silicon oxynitride region; and,
   (5) forming second conduction type source and drain impurity diffusion regions in surfaces of the substrate on both sides of the gate electrode.

7. The method as claimed in claim 6, wherein either the substrate is of P conduction type and the source and drain impurity diffusion regions are of N conduction type or the substrate is of N conduction type and the source and drain impurity diffusion regions are of P conduction type.

8. The method as claimed in claim 6, wherein the annealing in the NO ambient is conducted at a temperature in a range of 800~1000° C.

9. The method as claimed in claim 6, wherein the annealing in the N$_2$O ambient is conducted at a temperature in a range of 850~1100° C.

10. The method as claimed in claim 4, wherein a duration of the annealing is 20~30 minutes.

11. The method as claimed in claim 1, wherein the annealing in the NO ambient is conducted at a temperature of approximately 900° C.

12. The method as claimed in claim 1, wherein the annealing in the N$_2$O ambient is conducted at a temperature of approximately 950° C.

13. The method as claimed in claim 6, wherein the annealing in the NO ambient is conducted at a temperature of approximately 900° C.

14. The method as claimed in claim 6, wherein the annealing in the N$_2$O ambient is conducted at a temperature of approximately 950° C.

* * * * *